United States Patent
Kim et al.

(10) Patent No.: US 10,158,208 B2
(45) Date of Patent: Dec. 18, 2018

(54) METHOD FOR MEASURING AND SUPPRESSING REPETITION RATE PHASE NOISE OF FEMTOSECOND LASER USING OPTICAL FIBER DELAY LINE

(71) Applicant: Korea Advanced Institute of Science and Technology, Yuseong-gu, Daejeon (KR)

(72) Inventors: Jung Won Kim, Daejeon (KR); Kwang Yun Jung, Daejeon (KR)

(73) Assignee: KOREA ADVANCED INSTITUE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 15/558,965

(22) PCT Filed: Nov. 20, 2015

(86) PCT No.: PCT/KR2015/012513
§ 371 (c)(1),
(2) Date: Sep. 15, 2017

(87) PCT Pub. No.: WO2017/065344
PCT Pub. Date: Apr. 20, 2017

(65) Prior Publication Data
US 2018/0248333 A1    Aug. 30, 2018

(30) Foreign Application Priority Data

Oct. 12, 2015 (KR) .................. 10-2015-0142323

(51) Int. Cl.
*H01S 3/13* (2006.01)
*H01S 3/10* (2006.01)
(Continued)

(52) U.S. Cl.
CPC ...... *H01S 3/10053* (2013.01); *H01S 3/06754* (2013.01); *H01S 3/08013* (2013.01);
(Continued)

(58) Field of Classification Search
CPC .............. H01S 3/1315; H01S 3/06754; H01S 3/08013; H01S 3/10053; H01S 3/1106;
(Continued)

(56) References Cited

U.S. PATENT DOCUMENTS 5,561,551 A * 10/1996 Iwasaki ............... H01S 3/06754
                                                     359/337
6,782,017 B1 * 8/2004 Kai ........................ H01S 5/0687
                                                     359/247
(Continued)

FOREIGN PATENT DOCUMENTS

EP          0245026 A2    11/1987
JP          H08114528 A    5/1996
(Continued)

OTHER PUBLICATIONS

International Search Report for International Application No. PCT/KR2015/012513 dated Jun. 24, 2016, 2 pages.
(Continued)

*Primary Examiner* — Kinam Park
(74) *Attorney, Agent, or Firm* — TraskBritt

(57) ABSTRACT

Provided is a method of measuring a phase noise of a repetition rate of a femtosecond laser including generating a combined signal using a first wavelength element and a second wavelength element of an optical pulse train generated by the femtosecond laser, which is mode-locked, guiding the combined signal to a first path and a second path, allowing a signal of the second path to interfere with the signal of the first path, and outputting an interfering combined signal, dividing the interfering combined signal into a (Continued)

first interference signal and a second interference signal, converting the interference signals to radio frequency signals, and detecting a baseband signal including a frequency noise of the repetition rate from the radio frequency signals using a mixer.

17 Claims, 7 Drawing Sheets

(51) Int. Cl.
*H01S 3/067* (2006.01)
*H01S 3/08* (2006.01)
*H01S 3/11* (2006.01)
*H01S 5/068* (2006.01)
*H01S 5/065* (2006.01)
*H01S 5/062* (2006.01)

(52) U.S. Cl.
CPC .......... *H01S 3/1106* (2013.01); *H01S 3/1305* (2013.01); *H01S 3/1307* (2013.01); *H01S 5/0657* (2013.01); *H01S 5/06246* (2013.01); *H01S 5/06821* (2013.01); *H01S 2301/02* (2013.01)

(58) Field of Classification Search
CPC .. H01S 3/1307; H01S 2301/02; H01S 5/0657; H01S 5/06246; H01S 5/06821
See application file for complete search history.

(56) References Cited

U.S. PATENT DOCUMENTS

| | | | |
|---|---|---|---|
| 2003/0107743 A1* | 6/2003 | Van Wiggeren ... | G01B 9/02004 356/477 |
| 2004/0017833 A1* | 1/2004 | Cundiff ................. | H01S 3/1112 372/18 |

FOREIGN PATENT DOCUMENTS

| | | |
|---|---|---|
| JP | 2000323784 A | 11/2000 |
| JP | 2003172604 A | 6/2003 |
| JP | 2011242345 A | 12/2011 |
| JP | 2014045096 A | 3/2014 |
| KR | 101388727 B1 | 4/2014 |
| KR | 20140081910 A | 7/2014 |
| KR | 20150002050 A | 1/2015 |

OTHER PUBLICATIONS

International Written Opinion for International Application No. PCT/KR2015/012513 dated Jun. 24, 2016, 5 pages.

\* cited by examiner

METHOD FOR MEASURING AND SUPPRESSING REPETITION RATE PHASE NOISE OF FEMTOSECOND LASER USING OPTICAL FIBER DELAY LINE

CROSS-REFERENCE TO RELATED APPLICATIONS

This application is a national phase entry under 35 U.S.C. § 371 of International Patent Application PCT/KR2015/012513, filed Nov. 20, 2015, designating the United States of America and published as International Patent Publication WO 2017/065344 A1 on Apr. 20, 2017, which claims the benefit under Article 8 of the Patent Cooperation Treaty to Korean Patent Application Serial No. 10-2015-0142323, filed Oct. 12, 2015.

TECHNICAL FIELD

The present invention relates to a method of measuring and suppressing a phase noise of a repetition rate of a femtosecond laser, and more particularly, to a method of measuring and suppressing a phase noise of a repetition rate of a pulse laser based on a relatively high resolution power using an optical fiber delay line.

BACKGROUND

A femtosecond laser may continuously generate a relatively short optical pulse of a femtosecond scale on a predetermined cycle. Femtosecond laser technology has a relatively short history of commercialization and industrial field utilization. Research on the femtosecond laser and various application fields related to the femtosecond laser is actively being conducted by many research institutions around the world.

Generally, a reference signal source that generates a reference signal is required to measure a phase noise of a repetition rate of an optical pulse train generated by a femtosecond pulse laser. That is, a noise is measured based on a method of comparing the reference signal to a signal to be measured. Thus, the reference signal may have noise of which a level is lower than or similar to that of the signal to be measured. Therefore, when the signal to be measured is an ultra low noise signal, there may be a difficulty in that two identical signal sources are required.

A method of measuring a phase noise of a radio frequency (RF) signal or a microwave signal may include a method of measuring the phase noise using one signal source. The method may guide the signal to be measured to two paths and then delay a signal of any one of the paths using an optical fiber link to measure a noise by comparing the delayed signal to a signal of the other path. However, there is a limit to measurement performance in case of applying the method to a method of measuring a phase noise of a repetition rate of a pulse laser. The related methods of measuring the phase noise of the repetition rate of the pulse laser without an additional signal source may not have a sufficiently high resolution power such that the methods are unable to measure the phase noise throughout a wide Fourier frequency.

Thus, there is a need for a technology capable of measuring the phase noise of the repetition rate of the pulse laser having a high resolution power without an additional signal source.

BRIEF SUMMARY

Technical Solutions

According to an aspect of the present invention, there is provided a method of measuring a phase noise of a repetition rate of a femtosecond laser, the method including generating a combined signal using a first wavelength element and a second wavelength element of an optical pulse train generated by the femtosecond laser, which is mode-locked, guiding the combined signal to a first path and a second path, delaying a signal of the first path, shifting a frequency, allowing a signal of the second path to interfere with the signal of the first path, and outputting an interfering combined signal, dividing the interfering combined signal into a first interference signal corresponding to the first wavelength element and a second interference signal corresponding to the second wavelength element, converting the first interference signal to a first radio frequency signal and the second interference signal to a second radio frequency signal using a photoelectric device, and detecting a baseband signal including a frequency noise of the repetition rate from the first radio frequency signal and the second radio frequency signal using a mixer.

The method of measuring a phase noise of a repetition rate of a femtosecond laser may further include obtaining the first wavelength element and the second wavelength element from the optical pulse train using a dense wavelength division multiplexing (DWDM) filter. The method of measuring a phase noise of a repetition rate of a femtosecond laser may further include amplifying the combined signal using an erbium-doped fiber amplifier (EDFA).

The first path may include a dispersion compensated fiber configured to delay the signal of the first path and an acousto-optic modulator (AOM) configured to shift the frequency of the signal of the first path. The dispersion compensated fiber may have a length of at least 1 kilometer. A Faraday rotator mirror (FRM) may be disposed at each end of the first path and the second path.

The converting may include obtaining the first radio frequency signal by allowing the first interference signal to pass through a first photodiode, a first band pass filter (BPF), and a first amplifier, and obtaining the second radio frequency signal by allowing the second interference signal to pass through a second photodiode, a second BPF, and a second amplifier.

The method of measuring a phase noise of a repetition rate of a femtosecond laser may further include outputting a feedback signal by allowing the baseband signal to pass through a loop filter. The method of measuring a phase noise of a repetition rate of a femtosecond laser may further include providing the feedback signal for a piezoelectric element in the femtosecond laser.

The method of measuring a phase noise of a repetition rate of a femtosecond laser may further include measuring the frequency noise of the repetition rate at a Fourier frequency being greater than or equal to a lock bandwidth from the baseband signal and measuring the frequency noise of the repetition rate at the Fourier frequency being within the lock bandwidth from the feedback signal using a spectrum analyzer. The method of measuring a phase noise of a repetition rate of a femtosecond laser may further include calculating the phase noise of the repetition rate based on the measured frequency noise of the repetition rate.

According to another aspect of the present invention, there is provided a method of suppressing a phase noise of a repetition rate of a femtosecond laser, the method including generating a combined signal using a first wavelength element and a second wavelength element of an optical pulse train generated by the femtosecond laser, which is mode-locked, guiding the combined signal to a first path and a second path, delaying a signal of the first path, shifting a frequency, allowing a signal of the second path to interfere with the signal of the first path, and outputting an interfering combined signal, dividing the interfering combined signal into a first interference signal corresponding to the first wavelength element and a second interference signal corresponding to the second wavelength element, converting the first interference signal to a first radio frequency signal and the second interference signal into a second radio frequency signal using a photoelectric device, detecting a baseband signal including a frequency noise of the repetition rate from the first radio frequency signal and the second radio frequency signal using a mixer, obtaining a first feedback signal by allowing the baseband signal to pass through a first loop filter and obtaining a second feedback signal by allowing the baseband signal to pass through a second loop filter, and providing the first feedback signal for a piezoelectric element in the femtosecond laser and providing the second feedback signal for an electro-optic modulator in the femtosecond laser.

The method of suppressing a phase noise of a repetition rate of a femtosecond laser may further include obtaining the first wavelength element and the second wavelength element from the optical pulse train using a dense wavelength division multiplexing (DWDM) filter. The method of suppressing a phase noise of a repetition rate of a femtosecond laser may further include amplifying the combined signal using an erbium-doped fiber amplifier (EDFA).

The first path may include a dispersion compensated fiber configured to delay the signal of the first path and an acousto-optic modulator (AOM) configured to shift the frequency of the signal of the first path. The dispersion compensated fiber may have a length of at least 1 kilometer. A Faraday rotator mirror (FRM) may be disposed at each end of the first path and the second path.

The converting may include obtaining the first radio frequency signal by allowing the first interference signal to pass through a first photodiode, a first band pass filter (BPF), and a first amplifier, and obtaining the second radio frequency signal by allowing the second interference signal to pass through a second photodiode, a second BPF, and a second amplifier.

DETAILED DESCRIPTION

Figure 1:
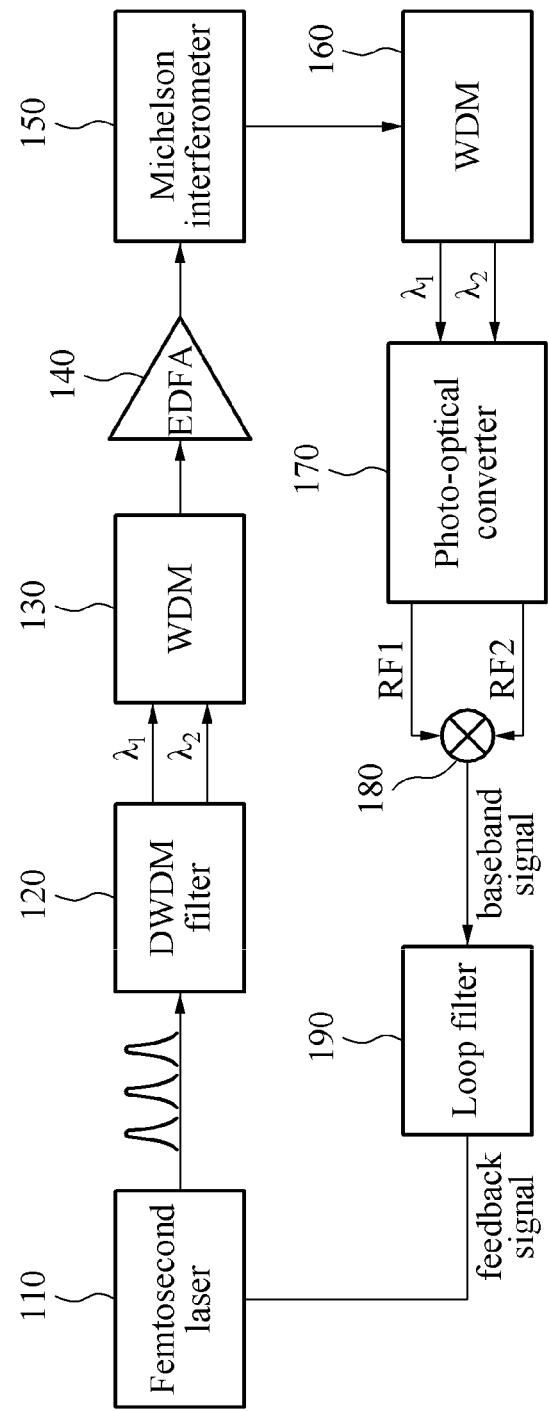
FIG. 1 is a diagram illustrating a method of measuring a phase noise of a repetition rate of a femtosecond laser according to an embodiment.

Hereinafter, some example embodiments will be described in detail with reference to the accompanying drawings. Regarding the reference numerals assigned to the elements in the drawings, it should be noted that the same elements will be designated by the same reference numerals, wherever possible, even though they are shown in different drawings. Also, in the description of embodiments, detailed description of well-known related structures or functions will be omitted when it is deemed that such description will cause ambiguous interpretation of the present disclosure.

The following detailed structural or functional description of example embodiments is provided as an example only and various alterations and modifications may be made to the example embodiments. Accordingly, the example embodiments are not construed as being limited to the disclosure and should be understood to include all changes, equivalents, and replacements within the technical scope of the disclosure.

Terms, such as "first," "second," and the like, may be used herein to describe components. Each of these terminologies is not used to define an essence, order or sequence of a corresponding component but used merely to distinguish the corresponding component from other component(s). For example, a first component may be referred to as a second component, and similarly the second component may also be referred to as the first component.

It should be noted that if it is described that one component is "connected," "coupled," or "joined" to another component, a third component may be "connected," "coupled," and "joined" between the first and second components, although the first component may be directly connected, coupled, or joined to the second component. On the contrary, it should be noted that if it is described that one component is "directly connected," "directly coupled," or "directly joined" to another component, a third component may be absent. Expressions describing a relationship between components, for example, "between," "directly between," or "directly neighboring," etc., should be interpreted to be alike.

The singular forms "a," "an," and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms, including technical and scientific terms, used herein have the same meaning as commonly understood by one of ordinary skill in the art to which this disclosure pertains. Terms, such as those defined in commonly used dictionaries, are to be interpreted as having a meaning that is consistent with their meaning in the context of the relevant art, and are not to be interpreted in an idealized or overly formal sense unless expressly so defined herein.

Reference will now be made in detail to embodiments of the present invention, examples of which are illustrated in the accompanying drawings, wherein like reference numerals refer to the like elements throughout. The embodiments are described below in order to explain the present invention by referring to the figures.

FIG. 1 is a diagram illustrating a method of measuring a phase noise of a repetition rate of a femtosecond laser according to an embodiment. A femtosecond laser 110, which is mode-locked generates an optical pulse train including a continuously occurring optical pulse having a predetermined cycle. In an example, the optical pulse train generated by the femtosecond laser 110, which is mode-locked, is transmitted to a dense wavelength division multiplexing (DWDM) filter 120.

The DWDM filter 120 may obtain a first wavelength element $\lambda_1$ and a second wavelength element $\lambda_2$ of the optical pulse train by filtering the optical pulse train to have a relatively narrow line width. Here, as a gap between two wavelengths is wide, a measurement sensitivity of a phase noise of a repetition rate increases. A wavelength division multiplexer (WDM) 130 may generate a combined signal by guiding the first wavelength element $\lambda_1$ and the second wavelength element $\lambda_2$ to an identical path.

Each output of the first wavelength element $\lambda_1$ and the second wavelength element $\lambda_2$ of the optical pulse train may be weakened in a wavelength filtering process and thus, an output of the combined signal may be also weak. Therefore, the combined signal may be amplified using an erbium-doped fiber amplifier (EDFA) 140.

A Michelson interferometer 150 guides the amplified combined signal to different two paths, delays a signal of one path using an optical fiber link, shifts a frequency by a predetermined radio frequency $f_m$, allows a signal of the other path to interfere with the signal of one path, and then outputs an interfering combined signal. Based on such a method, an interfering signal for each wavelength element may be output. A phase difference between the wavelength elements that pass through different paths when an interference occurs may be converted to light intensity information. Detailed description of the Michelson interferometer 150 will be provided with reference to FIG. 2.

A wavelength division multiplexing (WDM) 160 may divide the interfering combined signal into a first interference signal corresponding to the first wavelength element $\lambda_1$ and a second interference signal corresponding to the second wavelength element $\lambda_2$, and guide the first interference signal and the second interference signal to different paths. The first interference signal is converted to a first radio frequency signal RF1 and the second interference signal is converted to a second radio frequency signal RF2 in a photo-optical converter 170. Here, the converted radio frequency signal may have a carrier with a frequency that is two times the shifted radio frequency $f_m$. That is, each of the first radio frequency signal RF1 and the second radio frequency signal RF2 may have a carrier with a frequency of 2 $f_m$. Information on a frequency noise of the repetition rate of the femtosecond laser 110 converted to the light intensity information by the Michelson interferometer 150 may be converted to phase information of the carrier. Detailed description of a structure of the photo-optical converter 170 will be provided with reference to FIG. 3.

When the first radio frequency signal RF1 and the second radio frequency signal RF2 are allowed to pass through a mixer 180, a common element of the first radio frequency signal RF1 and the second radio frequency signal RF2 may be cancelled and a baseband signal remains. Because the first radio frequency signal RF1 and the second radio frequency signal RF2 commonly have a carrier envelope offset frequency noise before the first radio frequency signal RF1 and the second radio frequency signal RF2 are passed through the mixer 180, the carrier envelope offset frequency noise may be cancelled when the first radio frequency signal RF1 and the second radio frequency signal RF2 are passed through the mixer 180. In addition, the carrier with the frequency of 2 $f_m$ may be cancelled when the first radio frequency signal RF1 and the second radio frequency signal RF2 are passed through the mixer 180. However, a frequency noise of a repetition rate with respect to a frequency difference between the first wavelength element $\lambda_1$ and the second wavelength element $\lambda_2$ is not cancelled and remains in the baseband signal because the frequency noise of the repetition rate is measured from each of different wavelength elements.

When the baseband signal including the frequency noise of the repetition rate is detected, the baseband signal including the frequency noise of the repetition rate may be mathematically converted to a phase noise of the repetition rate. However, the detected frequency noise of the repetition rate may be out of a linear range of an output of the mixer 180. Thus, a method of measuring a noise by feeding the baseband signal output by the mixer 180 to the femtosecond laser 110 and reducing the noise may be used.

A feedback signal may be output by allowing the baseband signal output by the mixer 180 to pass through a loop filter 190, and the feedback signal may be transmitted to a piezoelectric element, for example, pzt, in a resonator of the femtosecond laser 110 by applying the feedback signal to a lower bandwidth such that the noise is reduced. Alternatively, the feedback signal may be provided to a pump current when the piezoelectric element is not included in the femtosecond laser 110.

When a feedback is applied, a frequency noise of a repetition rate of a free oscillation femtosecond laser may be measured from the baseband signal and the feedback signal using a spectrum analyzer (not shown). In detail, in a case of the baseband signal output by the mixer 180, a noise may be suppressed at a Fourier frequency within a lock bandwidth by the feedback, such that the frequency noise of the repetition rate of the free oscillation femtosecond laser at the Fourier frequency greater than or equal to the lock bandwidth may be measured from the baseband signal using the spectrum analyzer. In addition, the frequency noise of the repetition rate of the free oscillation femtosecond laser at the Fourier frequency within the lock bandwidth may be measured from the feedback signal provided to the piezoelectric element using the spectrum analyzer.

Thus, when frequency noises measured using the baseband signal and the feedback signal are combined and mathematically converted to a phase noise, the phase noise of the repetition rate to be measured may be obtained.

Figure 2:
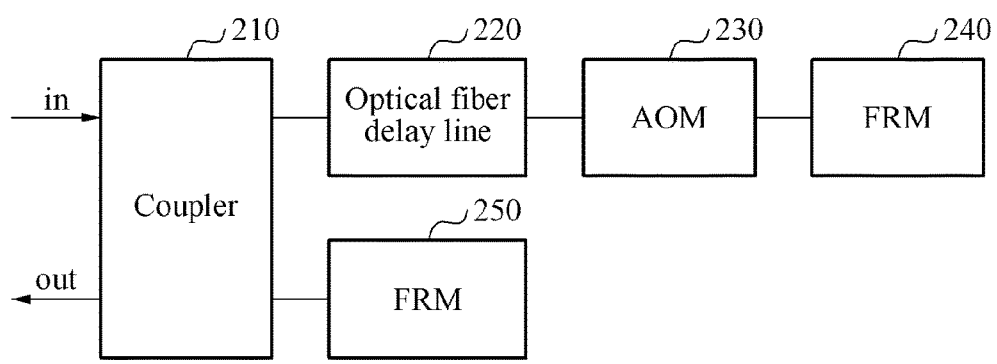
FIG. 2 is a block diagram illustrating a structure of a Michelson interferometer according to an embodiment.

FIG. 2 is a block diagram illustrating a structure of a Michelson interferometer according to an embodiment. For example, the structure of the Michelson interferometer illustrated in FIG. 2 may be used to implement a method of measuring a phase noise of a femtosecond laser 110 of FIG. 1. The Michelson interferometer includes a coupler 210, an optical fiber delay line 220, an acousto-optic modulator (AOM) 230, and Faraday rotator mirrors (FRMs) 240 and 250.

As illustrated in FIG. 2, the Michelson interferometer may include two different paths. For example, the Michelson interferometer includes a first path including the optical fiber delay line 220, the AOM 230, and the FRM 240, and a second path including the FRM 250.

The coupler 210 guides an input signal to the first path and the second path. The optical fiber delay line 220 delays a signal of the first path. For example, the optical fiber delay line 220 may include a dispersion compensated fiber having a length of kilometers. Because a phase difference is proportional to a value obtained by multiplying a frequency noise of an optical pulse train to a delay time of the first path, a measurement sensitivity of a noise may increase as an amount of the delay time increases using a long optical fiber. Thus, an optical fiber having a length of kilometers may be used to secure a sufficient amount of delay time. For example, a dispersion compensated optical fiber has a length of at least 1 kilometer.

The AOM 230 shifts a frequency of a signal of the first path. For example, the frequency of the first path may increase by a predetermined radio frequency $f_m$. In an example, a radio frequency source may be used to shift the frequency.

The signals traveling through the first path and the second path maintain a same polarization state to allow the signals traveling through the first path and the second path to interfere with each other. For this, the FRMs 240 and 250 are disposed at each end of the first path and the second path. In response to the FRMs 240 and 250 being disposed, the signals travelling through the first path and the second path and then returning to the coupler 210 may maintain the same polarization state. Thus, interference may be caused by guiding the signals of the first path and the second path to an identical path in the coupler 210.

Figure 3:
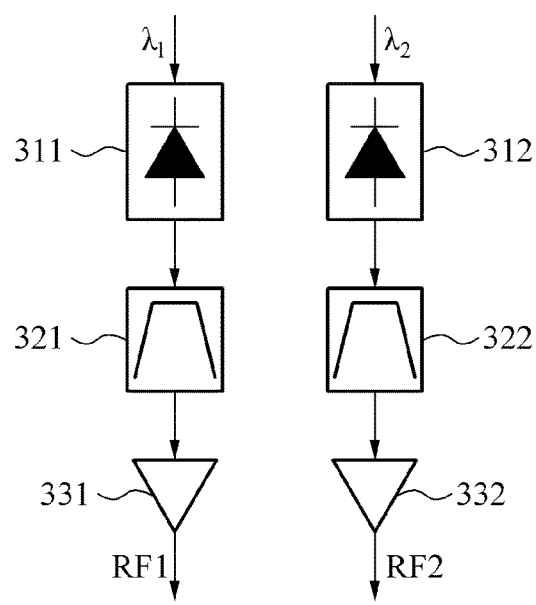
FIG. 3 is a block diagram illustrating a structure of a photo-optical converter according to an embodiment.

FIG. 3 is a block diagram illustrating a structure of a photo-optical converter according to an embodiment. For example, the structure of the photo-optical converter illustrated in FIG. 3 may be used to implement a method of measuring a phase noise of a femtosecond laser of FIG. 1. Similar to FIG. 1, an inputter of the photo-optical converter may be connected to the WDM 160 that divides an interfering combined signal into a first interference signal corresponding to a first wavelength element $\lambda_1$ and a second interference signal corresponding to a second wavelength element $\lambda_2$ and guides the first interference signal and the second interference signal to different paths. In addition, an outputter of the photo-optical converter may be connected to the mixer 180 that cancels a common element of two signals.

The photo-optical converter may include photodiodes 311 and 312, band pass filters (BPFs) 321 and 322, and amplifiers 331 and 332. The photo-optical converter may output a first radio frequency signal RF1 and a second radio frequency signal RF2 by receiving the first interference signal and the second interference signal. As illustrated in FIG. 3, each of the first interference signal and the second interference signal may travel each individual path and may be converted to an electrical signal. The photo-optical converter may be provided in a different structure using a photoelectric device differing from the illustrated example, and it is not limited to the illustrated example.

Figure 4:
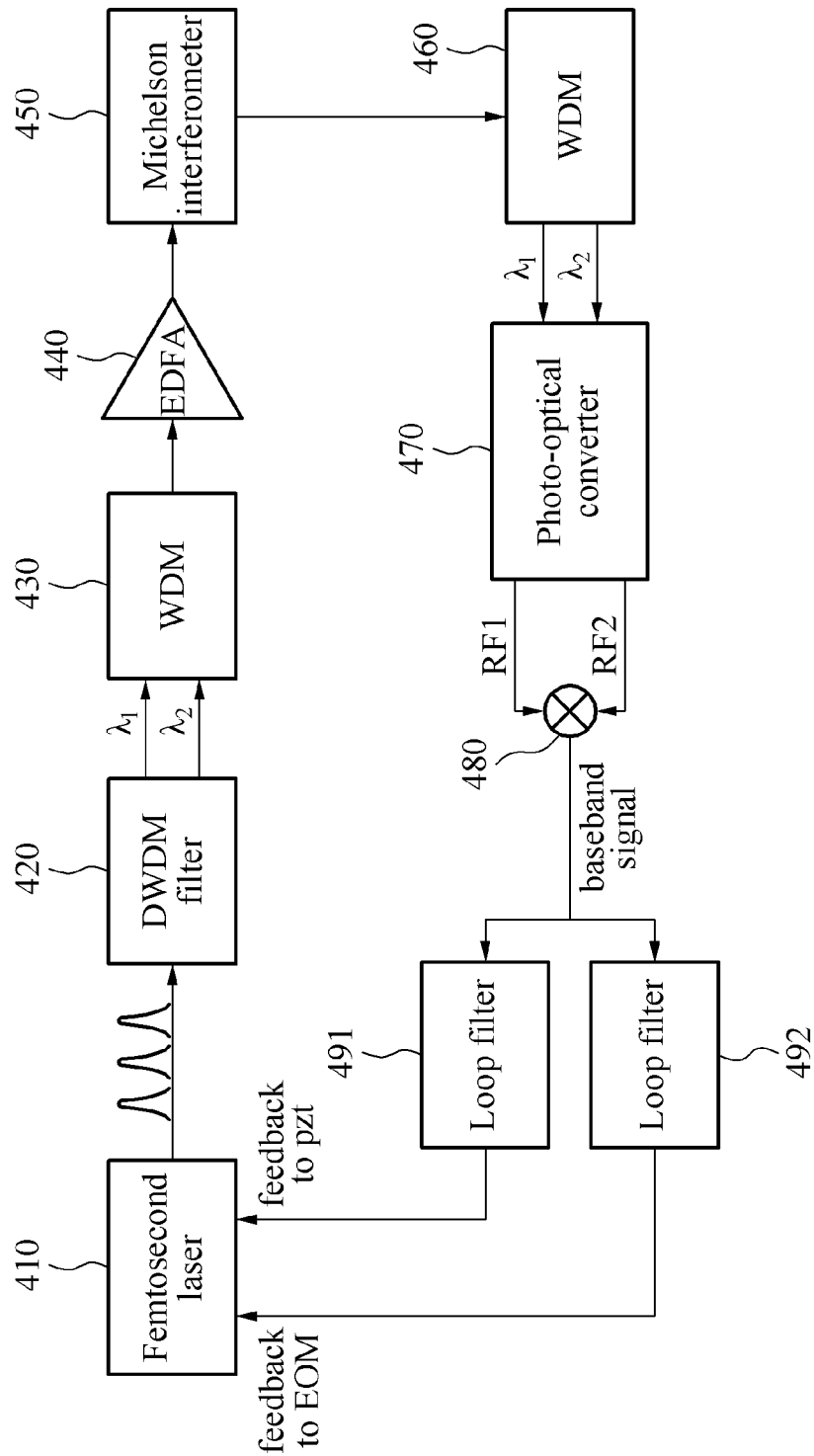
FIG. 4 is a diagram illustrating a method of suppressing a phase noise of a repetition rate of a femtosecond laser according to an embodiment.

FIG. 4 is a diagram illustrating a method of suppressing a phase noise of a repetition rate of a femtosecond laser according to an embodiment. A femtosecond laser 410, which is mode-locked, generates an optical pulse train including a continuously occurring optical pulse with a predetermined cycle. In an example, the optical pulse train generated by the femtosecond laser 410, which is mode-locked, is transmitted to a dense wavelength division multiplexing (DWDM) filter 420.

The DWDM filter 420 may obtain a first wavelength element $\lambda_1$ and a second wavelength element $\lambda_2$ of the optical pulse train by filtering the optical pulse train to have a relatively narrow line width. Here, as a gap between two wavelengths is wide, a measurement sensitivity of a phase noise of a repetition rate increases. A wavelength division multiplexer (WDM) 430 may generate a combined signal by guiding the first wavelength element $\lambda_1$ and the second wavelength element $\lambda_2$ to an identical path.

Each output of the first wavelength element $\lambda_1$ and the second wavelength element $\lambda_2$ of the optical pulse train may be weakened in a wavelength filtering process and thus, an output of the combined signal may be also weak. Therefore, the combined signal may be amplified using an erbium-doped fiber amplifier (EDFA) 440.

A Michelson interferometer 450 guides the amplified combined signal to different two paths, delays a signal of one path using an optical fiber link, shifts a frequency by a predetermined radio frequency $f_m$, allows a signal of the other path to interfere with the signal of one path, and then outputs an interfering combined signal. Based on such a method, an interfering signal for each wavelength element may be output. A phase difference between the wavelength elements that pass through different paths when an interference occurs may be converted to light intensity information.

A wavelength division multiplexing (WDM) 460 may divide the interfering combined signal into a first interference signal corresponding to the first wavelength element $\lambda_1$ and a second interference signal corresponding to the second wavelength element $\lambda_2$, and guide the first interference signal and the second interference signal to different paths. The first interference signal is converted to a first radio frequency signal RF1 and the second interference signal is converted to a second radio frequency signal RF2 in a photo-optical converter 470. Here, the converted radio frequency signal may have a carrier with a frequency that is two times the shifted radio frequency $f_m$. That is, each of the first radio frequency signal RF1 and the second radio frequency signal RF2 may have a carrier with a frequency of $2\ f_m$. Information on a frequency noise of the repetition rate of the femtosecond laser 410 converted to the light intensity information by the Michelson interferometer 450 may be converted to phase information of the carrier.

When the first radio frequency signal RF1 and the second radio frequency signal RF2 are allowed to pass through a mixer 480, a common element of the first radio frequency signal RF1 and the second radio frequency signal RF2 may be cancelled and a baseband signal remains. A process of obtaining the baseband signal including the frequency noise of the repetition rate using the mixer 480 is as described above with reference to FIG. 1.

To stabilize the phase noise of the repetition rate of the femtosecond laser 410 on the optical fiber link, the baseband signal output by the mixer 480 may be allowed to pass through two loop filters 491 and 492 such that a first feedback signal and a second feedback signal are output. The obtained first feedback signal and the second feedback signal may be provided to an electro-optic modulator (EOM) and a piezoelectric element, for example, pzt, in a resonator of the femtosecond laser 410. For example, the first feedback signal output by passing through the loop filter 491 is provided for the piezoelectric element, and the second feedback signal output by passing through the loop filter 492 is provided for the EOM.

Because a speed of the piezoelectric element is relatively slow while having a relatively wide operation range, feedback may not be performed with a sufficient bandwidth. Thus, the feedback may be performed with a high bandwidth to suppress the phase noise of the repetition rate when the EOM having a short operation range while having a fast speed is additionally provided.

The phase noise of the repetition rate of the femtosecond laser 410 suppressed based on such a method may be associated with a value obtained by dividing an amount of change in a delay time of the optical fiber link included in the Michelson interferometer 450 by a total delay time. Thus, to improve stabilization performance, it is necessary to minimize a change in a surrounding environment of the Michelson interferometer 450 including the optical fiber link.

To minimize the change in the surrounding environment of the Michelson interferometer 450, a method of surrounding the Michelson interferometer 450 with a shielding box may be used. In addition, a method of disposing a vibration suppressor in the Michelson interferometer 450 may be used. For example, a passive vibration isolation platform is used as the vibration suppressor.

Figure 5:
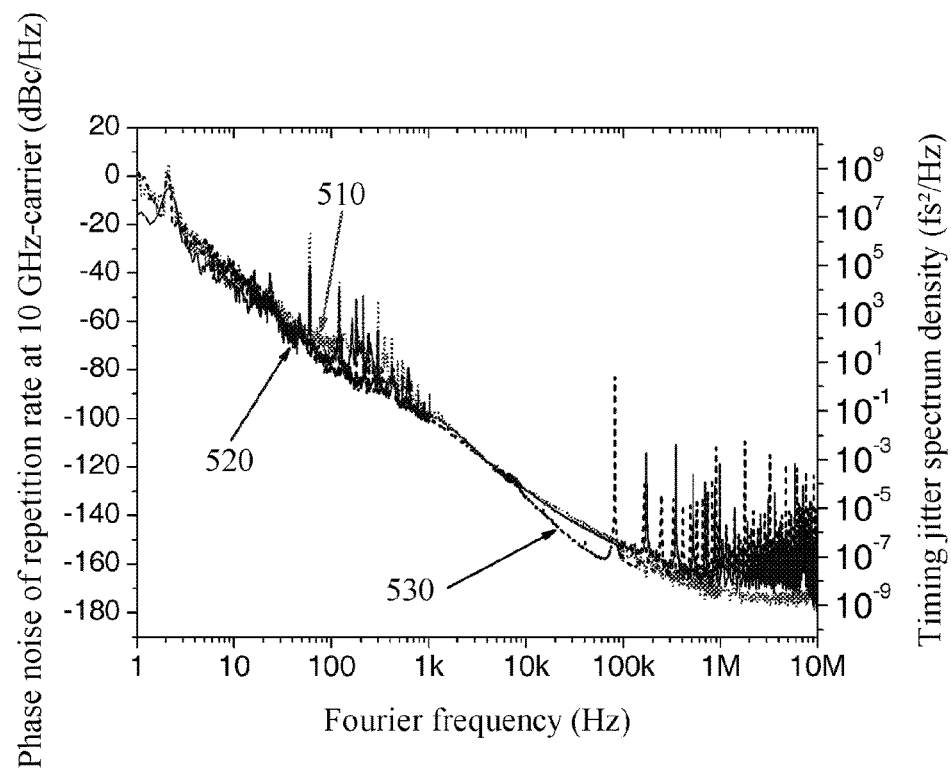
FIG. 5 is a graph illustrating a feature of a phase noise of a repetition rate of a femtosecond laser measured based on a method of measuring the phase noise of the repetition rate of the femtosecond laser according to an embodiment.

FIG. 5 is a graph illustrating a feature of a phase noise of a repetition rate of a femtosecond laser measured based on a method of measuring the phase noise of the repetition rate of the femtosecond laser according to an embodiment. The graph indicates results obtained by experiment. The graph indicates a measurement result 510 with respect to a first laser and a second laser based on a general measuring method using a balanced optical cross-correlator (BOC), a measurement result 520 with respect to the first laser based on a measurement method using a 1.2-kilometer delay line, and a measurement result 530 with respect to the second laser based on a measurement method using a 2.5-kilometer delay line.

As illustrated in the graph, measurements are performed with a very low background phase noise of about −168 dBc/Hz over a very wide Fourier frequency range (1 Hz through 10 MHz). The measurement result 530 obtained based on the measurement method using the 2.5-kilometer delay line shows that a peak is detected for each frequency corresponding to an integer multiple of 82 kHz. In a case of the method of measuring the phase noise using the optical delay line, a measurement sensitivity may disappear in principle at the Fourier frequency corresponding to the integer multiple of a reciprocal number of the delay time. Thus, lines indicating a measurement result may be thick when an offset frequency is greater than or equal to 1 MHz. An outline connecting lowest points of the thick lines indicates an actual phase noise suppressed by a background noise.

The measurement result 510 with respect to the first laser and the second laser based on the general measurement method using the BOC corresponds to a sum of the measurement result 520 and the measurement result 530. Thus, it is verified that the measurement result 520 and the measurement result 530 using the optical delay line indicate accurate measurement values.

Figure 6:
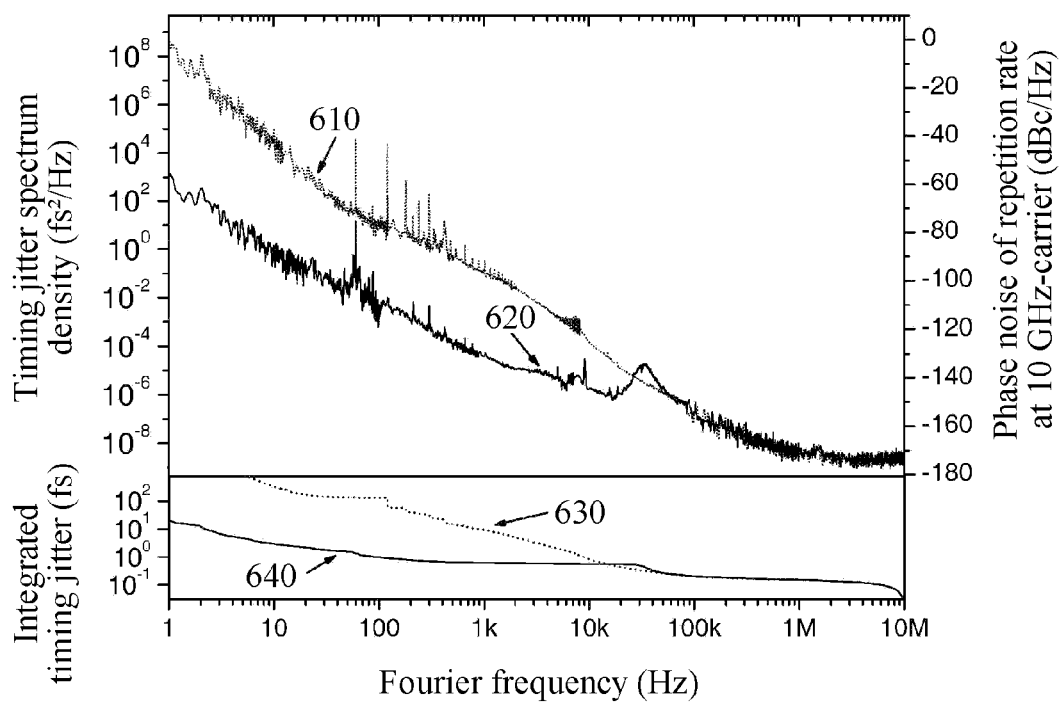
FIG. 6 is a graph illustrating a feature of a phase noise of a repetition rate of a femtosecond laser measured based on a method of suppressing the phase noise of the repetition rate of the femtosecond laser according to an embodiment.

FIG. 6 is a graph illustrating a feature of a phase noise of a repetition rate of a femtosecond laser measured based on a method of suppressing the phase noise of the repetition rate of the femtosecond laser according to an embodiment. A phase noise 610 of a repetition rate in a free oscillation state and a phase noise 620 of a repetition rate after a feedback is applied are illustrated. Also, an integrated timing jitter 630 in the free oscillation state and an integrated timing jitter 640 after the feedback is applied are illustrated.

As illustrated in FIG. 6, at a Fourier frequency less than or equal to 60 kHz corresponding to a lock bandwidth, it is verified that the phase noise after the feedback is applied is decreased by tens of decibels compared to the phase noise in the free oscillation state.

Figure 7:
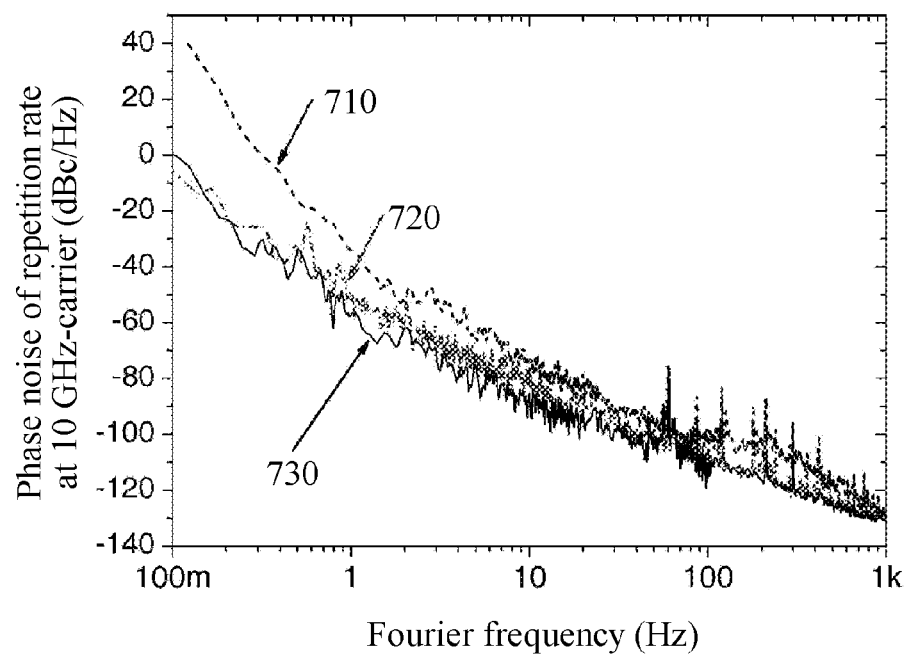
FIG. 7 is a graph illustrating a feature of a phase noise of a repetition rate of a femtosecond laser stabilized based on a method of suppressing the phase noise of the repetition rate of the femtosecond laser according to an embodiment.

FIG. 7 is a graph illustrating a feature of a phase noise of a repetition rate of a femtosecond laser stabilized based on a method of suppressing the phase noise of the repetition rate of the femtosecond laser according to an embodiment. Referring to FIG. 7, phase noises of the repetition rate of the femtosecond laser stabilized based on a shielding state of a Michelson interferometer including an optical fiber link may be compared. In detail, the graph shows a case 710 in which a shielding box is absent, a case 720 in which the shielding box is used, and a case 730 in which the shielding box and a vibration suppressor are used.

Figure 8:
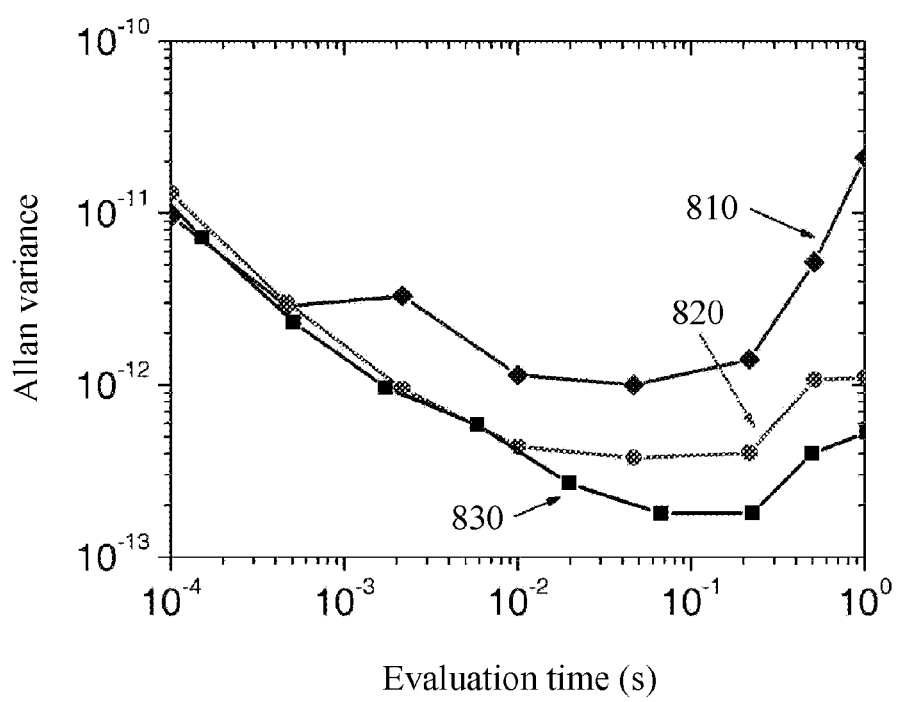
FIG. 8 is a graph illustrating an Allan variance with respect to a repetition rate of a femtosecond laser stabilized based on a method of suppressing a phase noise of the repetition rate of the femtosecond laser according to an embodiment.

FIG. 8 is a graph illustrating an Allan variance with respect to a repetition rate of a femtosecond laser stabilized based on a method of suppressing a phase noise of the repetition rate of the femtosecond laser according to an embodiment. Referring to FIG. 8, Allan variances with respect to the repetition rate of the femtosecond laser stabilized based on a shielding state of a Michelson interferometer including an optical fiber link may be compared. In detail, the graph shows a case 810 in which a shielding box is absent, a case 820 in which the shielding box is used, and a case 830 in which the shielding box and a vibration suppressor are used.

The units and/or modules described herein may be implemented using hardware components, software components, and/or combination thereof. For example, the hardware components may include microphones, amplifiers, band-pass filters, audio-to-digital convertors, and processing devices. A processing device may be implemented using one or more hardware devices configured to carry out and/or execute program code by performing arithmetical, logical, and input/output operations. The processing device(s) may include a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct and/or configure the processing device to operate as desired, thereby transforming the processing device into a special-purpose processor. Software and data may be embodied permanently or temporarily in any type of machine, component, physical or virtual equipment, computer-storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer-readable recording mediums.

The methods according to the above-described example embodiments may be recorded in non-transitory computer-readable media, including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blu-ray discs; magneto-optical media such as optical discs; and hardware devices that are specially configured to store and perform program instructions, such as read-only memory (ROM), random access memory (RAM), Flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents.

Accordingly, other implementations are within the scope of the following claims.

The invention claimed is:

1. A method of measuring a phase noise of a repetition rate of a femtosecond laser, the method comprising:
generating a combined signal using a first wavelength element and a second wavelength element of an optical pulse train generated by the femtosecond laser, which is mode-locked;
guiding the combined signal to a first path and a second path, delaying a signal of the first path, shifting a frequency, allowing a signal of the second path to interfere with the signal of the first path, and outputting an interfering combined signal;
dividing the interfering combined signal into a first interference signal corresponding to the first wavelength element and a second interference signal corresponding to the second wavelength element;
converting the first interference signal to a first radio frequency signal and the second interference signal to a second radio frequency signal using a photoelectric device; and
detecting a baseband signal including a frequency noise of the repetition rate from the first radio frequency signal and the second radio frequency signal using a mixer.

2. The method of claim 1, further comprising:
obtaining the first wavelength element and the second wavelength element from the optical pulse train using a dense wavelength division multiplexing (DWDM) filter.

3. The method of claim 1, further comprising:
amplifying the combined signal using an erbium-doped fiber amplifier (EDFA).

4. The method of claim 1, wherein the first path includes a dispersion compensated fiber configured to delay the signal of the first path and an acousto-optic modulator (AOM) configured to shift the frequency of the signal of the first path.

5. The method of claim 4, wherein the dispersion compensated fiber has a length of at least 1 kilometer.

6. The method of claim 1, wherein a Faraday rotator mirror (FRM) is disposed at each end of the first path and the second path.

7. The method of claim 1, wherein the converting comprises:
obtaining the first radio frequency signal by allowing the first interference signal to pass through a first photodiode, a first band pass filter (BPF), and a first amplifier; and
obtaining the second radio frequency signal by allowing the second interference signal to pass through a second photodiode, a second BPF, and a second amplifier.

8. The method of claim 1, further comprising:
outputting a feedback signal by allowing the baseband signal to pass through a loop filter.

9. The method of claim 8, further comprising:
providing the feedback signal for a piezoelectric element in the femtosecond laser.

10. The method of claim 8, further comprising:
measuring the frequency noise of the repetition rate at a Fourier frequency being greater than or equal to a lock bandwidth from the baseband signal and measuring the frequency noise of the repetition rate at the Fourier frequency being within the lock bandwidth from the feedback signal using a spectrum analyzer; and
calculating the phase noise of the repetition rate based on the measured frequency noise of the repetition rate.

11. A method of suppressing a phase noise of a repetition rate of a femtosecond laser, the method comprising:
generating a combined signal using a first wavelength element and a second wavelength element of an optical pulse train generated by the femtosecond laser, which is mode-locked;
guiding the combined signal to a first path and a second path, delaying a signal of the first path, shifting a frequency, allowing a signal of the second path to interfere with the signal of the first path, and outputting an interfering combined signal;
dividing the interfering combined signal into a first interference signal corresponding to the first wavelength element and a second interference signal corresponding to the second wavelength element;
converting the first interference signal to a first radio frequency signal and the second interference signal into a second radio frequency signal using a photoelectric device;
detecting a baseband signal including a frequency noise of the repetition rate from the first radio frequency signal and the second radio frequency signal using a mixer;
obtaining a first feedback signal by allowing the baseband signal to pass through a first loop filter and obtaining a second feedback signal by allowing the baseband signal to pass through a second loop filter; and providing the first feedback signal for a piezoelectric element in the femtosecond laser and providing the second feedback signal for an electro-optic modulator in the femtosecond laser.

12. The method of claim 11, further comprising:
obtaining the first wavelength element and the second wavelength element from the optical pulse train using a dense wavelength division multiplexing (DWDM) filter.

13. The method of claim 11, further comprising:
amplifying the combined signal using an erbium-doped fiber amplifier (EDFA).

14. The method of claim 11, wherein the first path includes a dispersion compensated fiber configured to delay the signal of the first path and an acousto-optic modulator (AOM) configured to shift the frequency of the signal of the first path.

15. The method of claim 14, wherein the dispersion compensated fiber has a length of at least 1 kilometer.

16. The method of claim 11, wherein a Faraday rotator mirror (FRM) is disposed at each end of the first path and the second path.

17. The method of claim 11, wherein the converting comprises:
obtaining the first radio frequency signal by allowing the first interference signal to pass through a first photodiode, a first band pass filter (BPF), and a first amplifier; and
obtaining the second radio frequency signal by allowing the second interference signal to pass through a second photodiode, a second BPF, and a second amplifier.

\* \* \* \* \*